US006713408B1

(12) United States Patent
Shanmugam et al.

(10) Patent No.: US 6,713,408 B1
(45) Date of Patent: Mar. 30, 2004

(54) METHOD OF PRODUCING SILICA MICRO-STRUCTURES FROM X-RAY LITHOGRAPHY OF SOG MATERIALS

(75) Inventors: Vijay-Anandh Shanmugam, Sunnyvale, CA (US); Michael J. Vasile, Albuquerque, NM (US); Philip J. Coane, Farmerville, LA (US)

(73) Assignee: Louisiana Tech University Foundation, Inc., Ruston, LA (US)

( * ) Notice: Subject to any disclaimer, the term of this patent is extended or adjusted under 35 U.S.C. 154(b) by 56 days.

(21) Appl. No.: 10/017,138

(22) Filed: Dec. 14, 2001

Related U.S. Application Data

(60) Provisional application No. 60/255,503, filed on Dec. 14, 2000.

(51) Int. Cl.[7] .......................... H01L 21/31; H01L 21/469
(52) U.S. Cl. ..................... 438/781; 438/780; 438/795; 430/967
(58) Field of Search ............................. 438/780, 781, 438/795; 430/967

(56) References Cited

U.S. PATENT DOCUMENTS

| | | | | |
|---|---|---|---|---|
| 5,178,977 A | * | 1/1993 | Yamada et al. | 430/5 |
| 5,306,601 A | * | 4/1994 | Hashimoto et al. | 430/296 |
| 5,679,211 A | * | 10/1997 | Huang | 156/643.1 |
| 5,688,617 A | * | 11/1997 | Mikami et al. | 430/5 |
| 5,723,385 A | * | 3/1998 | Shen et al. | 438/763 |
| 6,162,745 A | * | 12/2000 | Ito et al. | 438/795 |
| 6,461,774 B1 | * | 10/2002 | Zimlich et al. | 430/5 |
| 6,534,244 B1 | * | 3/2003 | Zimlich et al. | 430/313 |
| 2002/0086542 A1 | * | 7/2002 | Shepard | 438/700 |
| 2003/0027083 A1 | * | 2/2003 | Fuller et al. | 430/322 |

OTHER PUBLICATIONS

C. Marzolin, S. Smith, M. Prentiss & G. Whitesides; *Fabrication of Glass Microstructures by Micro–Molding of Sol–Gel Precursors*; 1998; pp. 571–574: Advanced Materials, vol. 10, No. 8.

C. Li, M. Andrews, S. Najafi, J. Mackenzie & N. Peyghambarian; *Sol–Gel Integrated Optical Coupler by Ultaviolet Light Imprinting*; Feb. 16, 1995; pp. 271–272; Electronics Letters, vol. 31 No. 4.

P. Coudray, J. Chisham, M. Andrews & S. Najafi; *Ultraviolet Light Imprinted Sol–Gel Silica Glass Low–Loss Waveguides for Use at 1.55 μm*; Apr. 1997; pp. 1234–1240; Optical Engineering, vol. 36, No. 4.

Y. Han; *Investigation of Microlens Fabrication Processes*; Aug. 1998; Louisiana Tech University Thesis.

* cited by examiner

*Primary Examiner*—Alexander Ghyka
(74) *Attorney, Agent, or Firm*—Jones, Walker, Waechter, Poitevent, Carrere & Denegre, L.L.P.

(57) ABSTRACT

A lithographic method for producing high aspect ratio silica micro-structures having the steps of: providing a carrier substrate with a confinement boundary placed on the carrier substrate; placing the SOG material within the confinement boundary and soft baking at a temperature above its glass transition temperature; forming a pattern of interest on the soft baked SOG material by x-ray lithography; and heating the SOG material until it is substantially converted to a silica-like oxide.

22 Claims, 2 Drawing Sheets

Machining sequence for cast GR 650 thick films
(a) Soft-baked GR 650 thick film
(b) Machining up to the PTFE confinement ring
(c) Removal of the confinement ring
(d) Machining to the desired thickness.

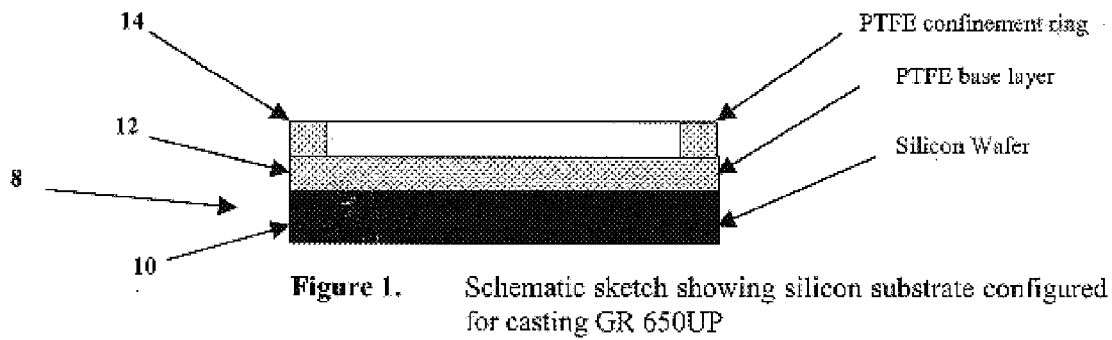
Figure 1. Schematic sketch showing silicon substrate configured for casting GR 650UP
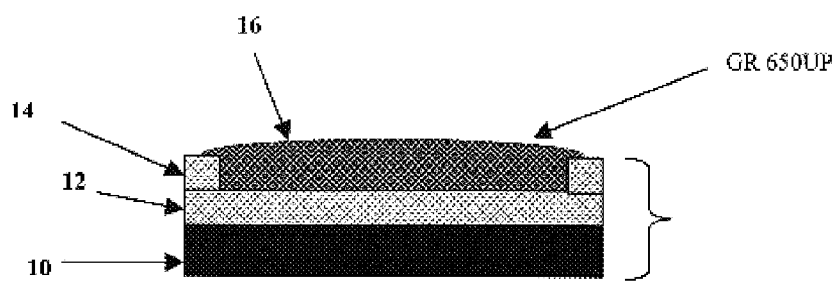
Figure 2. Overfilling of GR 650UP into the area confined by 125 μm thick PTFE ring.

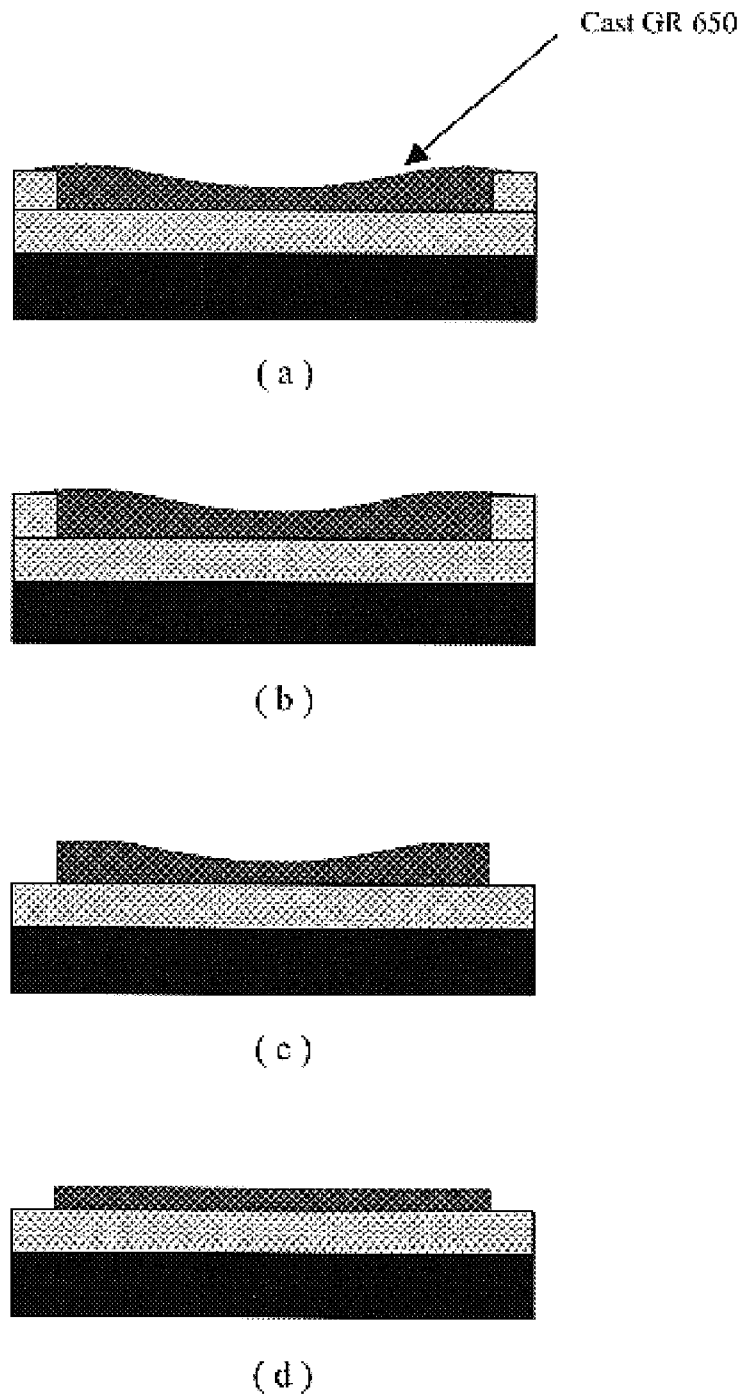
Figure 3. Machining sequence for cast GR 650 thick films
(a) Soft-baked GR 650 thick film
(b) Machining up to the PTFE confinement ring
(c) Removal of the confinement ring
(d) Machining to the desired thickness.

METHOD OF PRODUCING SILICA MICRO-STRUCTURES FROM X-RAY LITHOGRAPHY OF SOG MATERIALS

This application claims priority to U.S. provisional application Ser. No. 60/255,503, filed on Dec. 14, 2000, which is incorporated by reference herein in its entirety. U.S. provisional application Ser. No. 60/255,503, filed on Dec. 14, 2000, which is incorporated by reference herein in its entirety. This invention was developed in part with funds received from the U.S. Army Research Office in connection with grant No. DAAH04-96-1-0200.

BACKGROUND OF INVENTION

The present invention relates to methods of producing optical micro-structures. In particular, the present invention relates to using x-ray lithography on thick films of SOG materials to form the micro-structures.

There is an increasing use of integrated photonic and optoelectronic systems and a concurrent need for micro-optical components such as wave guides, couplers, lenses, prisms and similar devices for use in such systems. Silica is an excellent optical material because of its broad transmission range, low thermal expansion, high radiation hardness, mechanical strength and resistance to chemical attack. It is the basic constituent of optical fibers used in communication. Several prior art methods of producing silica micro-optical components begin with the step of forming silica films on a substrate such as a silicon wafer. These include a variety of chemical vapor deposition (CVD) and plasma-assisted deposition techniques. However, all these methods require high temperatures and/or vacuum techniques, and are generally suitable only for thin films.

Another method of forming silica films is through the use of organosilicon-based sol-gel and spin-on glass materials as precursors to silica. Sol-gel methods generally consist of gelation of silicon containing solutions which can be applied to a surface and then converted to silica through heating. The main advantage of sol gel methods is that silica may be produced at temperatures far lower than required for conventional melting processes. One technique for evenly distributing a silicon-based sol-gel film over a substrate consists of applying the sol-gel and then spinning the substrate at speeds sufficient to spread the gel across the substrate, hence the term "spin-on glass" or "SOG." SOG materials are usually spin-coated onto silicon wafers as thin films not exceeding 1 $\mu$m in a single coat. Thicker prior art SOG films on silicon wafers are prone to fail by cracking. The development of cracks in thick SOG films can be attributed to shrinkage during drying. Cracking of the film occurs because as shrinkage takes place, the SOG continues to adhere to the substrate, resulting in a buildup of tensile stress within the film. The thicker the film, the greater the shrinkage; and the greater the shrinkage, the greater the tensile stress in the film. In thick films, the magnitude of this tensile stress is severe enough to cause failure of the film. Thicker spin-coated SOG films can still be fabricated by a multiple-coating procedure where each coated layer is annealed before the application of the next layer. However, multiple coating involves too many repetitions, is too time consuming, and has difficulty in obtaining films with a thickness greater than 10 um. For the purposes of the disclosure herein, a "thick" film will be a film over 25 um.

The same type of sol-gels used for SOG techniques ("SOG materials") may also be used for molding techniques. Silica micro-structures, including micro-optical components, have been achieved by sol-gel micro-molding. See Marzolin, et al. 1998 and Han 1998. Typically these molds will be formed through some type of lithography and then the SOG material placed in the mold. However, problems with component release are to be expected with any molding method. Moreover, such problems could be avoided altogether if a process to fabricate these structures without a mold could be developed.

An example of direct lithography on a SOG material was found in Li et al., 1995 and Coudray et al., 1997. These methods involved direct UV lithography on a sol-gel processed photosensitive hybrid organosilicate glass and was used to fabricate waveguides and optical couplers. This is one of the few instances where actual products have been fabricated by direct lithography on a silicon precursor sol-gel film. Nevertheless, UV radiation typically will only penetrate a SOG material to a depth of a few tens of microns. This is generally not sufficient to produce high aspect ratio (e.g. a aspect ratio over approximately 8–10) which is desirable in many mirco-optical devices. The aspect ratio is generally defined as the height to width ratio of the structure. It would be a significant advance in the art if high aspect ratio silica structures could be formed directly onto a SOG material through a lithography process. This would provide the distinct advantage of manufacturing high aspect ratio silica structures without the need of a molding process.

SUMMARY OF INVENTION

The present invention provides a lithographic method for producing high aspect ratio silica micro-structures. The method comprises providing a carrier substrate with a confinement boundary placed on the carrier substrate. The SOG material is then placed within the confinement boundary and soft baked at a temperature above its glass transition temperature. Next, a pattern of interest is formed on the soft baked SOG material by x-ray lithography. Then the SOG material is heated until it is substantially converted to a silica-like oxide. This method provides a technique for moldless manufacture of silica-like micro-structures.

The present invention also includes a method of producing a hardened organosilicon film. This method also includes providing a carrier substrate and a SOG material have approximately the same coefficient of thermal expansion. A confinement boundary having a height of at least 25 microns is positioned on the carrier substrate and the SOG material placed within the confinement boundary. The SOG material is then soft baked at a temperature above the glass transition temperature of the SOG material in order to obtain a hardened organosilicon film.

BRIEF DESCRIPTION OF DRAWINGS

FIG. 1 is a side view of the carrier substrate and confinement boundary formed thereon.

FIG. 2 is a side view of the carrier substrate with an SOG material placed thereon.

FIGS. 3a–3d illustrate the processing steps performed on the hardened SOG material.

DETAILED DESCRIPTION OF INVENTION

As indicated above, prior art thick SOG films tend to develop cracks due to the adherence of the SOG film to the substrate as the film shrinks. The present invention avoids this difficulty by employing a substrate with a coefficient of thermal expansion which is approximately the same as that of the SOG material. Stresses may also be reduced by employing a substrate to which the SOG material has a lesser tendency to adhere.

In one embodiment of the present invention, the SOG material is a polymethylsilsesquioxane based material. One such material is sold under the tradename GR 650 by Techneglas, Inc., located at 25875 U.S. Rte 25, Levis Park, Bldg 52, Perrysburg, Ohio 43551. Techneglas supplies methylsilsesquioxane polymer resin as GR 650F flakes. This is also available in the solution form as GR 650UP, which is a 35.3% (by weight) solution of GR 650F in a 1:1 solvent mixture containing ethanol and n-butanol.

One suitable substrate to place the SOG material upon is a silicon wafer with a layer of polytetrafluoroethylene (PTFE or Teflon). It is noted that the coefficient of thermal expansion for these two materials is very similar with GR 650 being $130 \times 10^{-6}/°$ C. and PTFE being $124 \times 10^{-6}/°$ C. FIG. 1 illustrates a carrier substrate 8 which comprises a silicon wafer 10 with a layer of PTFE 12. Wafer 10 in this embodiment is a conventional four inch diameter, 540 um thick silicon wafer. One source of PTFE layer 12 is an acrylic based adhesive-backed PTFE film known as Chemfilm DF1200 and sold by Chemfab Corp. located in Merrimack, N.H. 03054. Chemfilm DF 1200 is available in various thicknesses, but the 125 um thick variety was used in the present embodiment. After layer 12 of the PTFE film is placed over wafer 10, a confinement boundary or ring 14 is formed. Confinement ring 14 may be constructed from the same Chemfilm DF 1200 material by cutting the PTFE film in a ring shape and adhering it to layer 12. In one example, confinement ring 14 has an inner diameter of 82 mm, but other sizes (and shapes) of confinement ring 14 could be created depending on the particular application. Likewise, while the 125 um Chemfilm DF 1200 produces a confinement boundary approximately 125 um high, it will be clear that other film thicknesses (or mulitple layers of a film) could produce different height confinement boundaries (e.g. 50 um, 100 um, 200 um, 300 um, or higher). Nor is it necessary that confinement ring 14 be a PTFE material, but could be any suitable material which could perform the functions of confinement ring 14. As an alternative to employing the Chemfilm DF 1200 as the layer 12, there are also PTFE compounds which may be formed directly on silicon wafer 10. One is a spin on Teflon manufactured by E. I. du Pont de Nemours & Co., Inc. of Wilmington, Del. and has a product ID # of PTFE-30 (DuPont Fluoropolymer Dispersion). This spin on PTFE compound has the advantage of providing a smoother surface area and eliminates the need for the film adhesive.

The construction of a carrier substrate 8 with a confinement ring 12 as seen in FIG. 1 allows the volume within confinement ring 14 to filled with a SOG material such as the GR 650UP solution described above. As suggested in FIG. 2, the confined volume 16 is slightly overfilled since the volume of GR 650UP is somewhat reduced during drying.

The GR 650UP will then be heated or "soft baked" to eliminate the majority of solvents in the GR 650UP solution. While explained in more detail in Example 1 below, the GR 650UP is heated at 75° C. which is above the glass transition temperature ($T_g$) of GR 650UP ($T_g$=67° C. This baking process includes a ramp up rate of 6° C./hr, a dwell time of 4 hours, and ramp down rate of 6° C./hr. These soft bake conditions result in a hardened continuous, transparent, crack-free consolidated GR 650 thick film that is soluble in organic solvents. One explanation for the absence of cracking in the GR 650 thick film is the fact that the thermal expansion coefficients of GR 650 and PTFE are closely matched. The acrylic adhesive which is present as a uniform coating prior to soft baking disintegrates to accommodate the differential expansions of the silicon wafer ($2.7 \times 10^{-6}/°$ C. coefficient of expansion) and the PTFE film. The adhesive layer thus functions as a buffer layer between the silicon wafer and PTFE film, and enables the fabrication of thick crack-free GR 650 films. If a spin on PTFE compound was being applied directly onto the carrier substrate, there will be no adhesive to act as a buffer layer. Therefore, when employing spin on PTFE it will be advisable to utilize a carrier substrate with a coefficient of expansion more closely matching PTFE than does silicon's coefficient of expansion.

As is known in the art, another method of removing solvents from the GR 650 material is to place the material in a vacuum environment. This is generally a more time consuming method than soft baking, but is an alternative which will remove the solvents and provide a hardened GR 650 film without the use of a bake process.

As seen in FIG. 3a, the soft-baked film 18 is generally not planar, but is thickest near the periphery and thinnest around the central region. It is therefore desirable to mill the GR 650 film to a planar shape. One method of accomplishing this is with a device such as the Precitech Optimum 2000 lathe using a diamond turning tool with a nose radius of 1 mm. The GR 650 film above confinement ring 14 is first milled off. Confinement ring 14 is then removed as in FIG. 3c and machining continued until the desired film thickness is obtained and soft-bake film 18 is substantially planar as seen in FIG. 3d.

The next step in the process of manufacturing the silica structures is to perform conventional x-ray lithography techniques on the hardened GR 650 film in the pattern of the desired micro-structures. In one embodiment of the invention, the desired pattern was produced with negative resist processing, i.e. the regions of the hardened GR 650 film not irradiated by x-rays are dissolved by an organic solvent such as methanol. The hardened GR 650 film may be patterned using conventional synchrotron radiation. Synchrotron storage rings typically provide a range of electron energies at levels between 0.8 and 7 GeV. However, for the purpose of the embodiments disclosed herein, energy levels of 1.3 and 1.5 were typically employed. A conventional lithography mask having the desired patterns (e.g. microlens, micro-prisms, micro-channels, etc.) is positioned over the hardened GR 650 film. The x-ray exposure dose needed to pattern the GR 650 film may be calculated by conventional methods such as the "TRANSMIT" program developed by the University of Wisconsin, Madison. When employing broad band synchrotron radiation, there is an attenuation of the beam energy as it travels through the resist. Therefore, for a given value of dose at the bottom of the resist, the top surface of the resist receives a higher photon flux. The ratio of the dose at the top and bottom surfaces of the resist defines the dose ratio. The dose ratio is reduced when higher beam energy is used. Thus, the 1.5 GeV beam yields a considerably lower dose ratio compared to the 1.3 GeV beam and energy levels above 1.5 GeV would provide still lower dose ratios. A low dose ratio is desirable because it translates to an increased height/thickness of structures that can be patterned by X-rays for a given bottom dose. The dose ratio can be further reduced by the use of filters as suggested in Table 1.

|  | Dose Ratio | | |
| --- | --- | --- | --- |
|  | With No Additional Filter | With 19 μm Aluminum Filter | With 29 μm Aluminum Filter |
| beam | 12.5 | 3.6 | 2.85 |
| beam | 8.1 | 2.8 | 2.3 |

It was generally found that a bottom dose of at least approximately 10 kJ/cm$^3$ was sufficient to develop the bottom most section of a 100 um thick GR 650 resist while resists receiving bottom doses of less than approximately 6 kJ/cm$^3$ showed evidence of being underdeveloped. It is desirable to maintain a lower dose ratio in order to not over-expose the top of the resist. Thus, using a 1.5 GeV beam with a filter is a preferred method of irradiating the resist. It also is expected that still lower dose ratios than seen in Table 1 would be achieved with a 2.5 GeV beam.

Unexposed GR 650 resist dissolves in most non-polar organic solvents like alcohols and ketones. X-ray irradiated regions in the resist film, irradiated with a dose sufficient to cause cross-linking, do not dissolve in these solvents. Therefore, GR 650 functions as a negative resist when an organic solvent is used as the developing medium. In the embodiments discussed herein, most of the development of GR 650 patterns is performed with methanol. One method in which development may be carried out is to secure the carrier substrate in a wafer holder and immerse it face down in a beaker containing methanol at 25° C. with a stirrer set to rotate at 120 rpm. Ten minutes in methanol under these conditions is usually sufficient to remove the unexposed resist. Alternatively, ethanol yields a similar result. However, other organic solvents such as isopropyl alcohol, acetone, or methanol diluted with water appear to give less satisfactory results. Therefore, resist development in 100% methanol is at least one preferred method. The development resulted in structures with an approximately 100 um depth. When employed with structures like wave guides, this results in aspect ratios of 10:1 or more.

For some applications, micro-optical structures formed of hardened GR 650 (formed through soft baking or a vacuum process) may be suitable for use without conversion to silica. However, where silica type structures are desired, it is necessary to vitrify the GR 650 structure to convert it to a silica-like oxide. Various degrees of heating are reported in the prior art to vitrify GR 650, although none of these concern GR 650 exposed to x-ray radiation. As a bench mark, the thermal oxide method of converting silicon to silicate provides a relatively pure form of silica having a oxygen to silicon (O-Si) ratio of 1.85:1. Vitrifying the GR 650 structures at 400° C. for a dwell time of 2 hrs with a ramp up and ramp down rate of 15° C./hr produced a bottom section O-Si ratio of 1.49:1 and a top section ratio of 1.89:1. In this instance, the bottom section had received a dose of approximately 10 kJ/cm$^3$ and the top section a dose of approximately 125 kJ/cm$^3$. The variations in O-Si ratio are significantly influenced by the x-ray dosage received by the different sections of the resist. A more uniform O-Si ratio should also be attainable by utilizing a dosage ratio closer to 1. Additionally, those skilled in the lithography area will likely be able to obtain similar results above and below 400° C. with variations in the vitrification times. While the resulting structures may not be pure silica (i.e. there remains some organics or other non-silica components), the structures are a silica-like oxide sufficiently close to a pure silica to effectively operate as optical devices in many applications.

One problem noted in the vitrification process was the upward curling of the silica-like oxide structures at their ends. It is believed this problem is related to denser silica-like structure at the top (O-Si ratio of 1.89:1) as opposed to the bottom (O-Si ratio of 1.49:1), which may introduce a differential stress in the structure. It is also believed that the higher 1.89:1 ratio is caused at least in part by oxygen diffusing from the environment into the top layer of the structure after irradiation. Normally this diffusion of oxygen will not progress more than approximately 15 um into the top surface. Therefore, etching off this top 15 um before vitrification should result in a structure having a lesser differential stress and should prevent the curling difficulties. One suitable method of etching off the top 15 um of the methanol developed resist is to expose the resist to a buffered hydrofluoric acid ("BHF"), which unlike methanol, will dissolve the irradiated areas of the resist. The BHF solution may consist of 6 parts by volume HF acid and 1 part by volume ammonium fluoride (in a 40% saturated solution). Immersing the resist in the BHF solution for approximately 2 minutes will be sufficient for etching off the top 15 um of the resist. Then the vitrification process may be carried out as described above.

The following examples are illustrative of experiments carried out using the method of the present invention.

EXAMPLE 1

A 125 μm thick DF1200 PTFE film was bonded onto a standard 4" silicon wafer (crystal orientation being of no consequence). A 540 um-thick silicon wafer provided sufficient rigidity for the purpose. Care was taken to prevent trapping air pockets while bonding the PTFE film. Excess film was trimmed off the edges of the wafer. This layer of PTFE was called the 'base layer'. Another 125 μm thick PTFE film was then cut in the shape of a ring and bonded on top of the first PTFE layer. This PTFE ring known as the 'confinement ring' had an inner diameter of 82 mm. The outer diameter was not critical and could be any value that would accommodate the ring on the silicon wafer. The built-up configuration enabled casting of GR 650UP into it.

GR 650 casting and soft-baking were carried out using the Heraeus oven in the clean room at the Institute for Micromanufacturing (IfM) in Ruston, La. The followings are the steps involved in obtaining a thick GR 650 casting:

1. The substrate with the PTFE base layer and confinement ring was cleaned using acetone and water and then dried by blowing nitrogen gas over the substrate.
2. The sample was then placed flat and level in the Heraeus oven. GR 650UP was dispensed into the confined area of the substrate using a syringe fitted with a 0.2 um filter. It takes about 6 cc of GR 650UP to wet and fill the entire area of the substrate within the confinement ring. A little excess GR 650UP is needed because the volume of GR 650UP reduces during drying. Otherwise, the final thickness of film achievable will be lesser than the target thickness. Excess casting also prevents the formation of a 'bare patch' in the dried casting.
3. The sample was evacuated at 200 mbar for 5 minutes in the Heraeus oven to extract some of the solvent while the casting is still in a low viscosity state.
4. The cast GR 650UP was then soft-baked in the Heraeus oven. The conditions used in the soft-bake are listed in Table 2.

| | |
|---|---|
| Ramp up rate | 6° C./hr |
| Set temperature | 75° C. |
| Dwell time | 4 hrs |
| Ramp down rate | 50° C./hr |

Vacuum was not used for drawing the solvents away during the soft-bake because uncontrolled evaporation of the solvents from the GR 650 film resulted in bubbles and bubble-artifacts in the film. The oven door was left slightly open for the solvent vapors to escape instead of using a vacuum.

The retention of bubbles in the soft-baked film may be a result of the increase in viscosity of the cast material. The soft-baking temperature was fixed at 75° C., which is greater than the glass transition temperature ($T_g$) for GR 650 ($T_g=67°$ C.) but less than the boiling point of the lower boiling solvent (boiling point of ethanol=78.5° C.) in GR 650UP. Heating the cast material to a temperature at or above 78.5° C. resulted in formation of bubbles on the resulting film. Excessive temperature ramp up was also found to contribute to formation of bubbles. Therefore, an optimal temperature ramp rate had to be determined by trial and error. The occurrence of bubbles was found to increase with the volume of GR 650UP cast. The dwell time was designed to provide sufficient time for driving the solvent out of the casting and to consolidate the resulting mass. The ramp down rate, also determined empirically, functions to anneal the film and control the stress in the film. This operation reduces the residual stress in the film and prevents cracking.

The soft-bake conditions shown in Table 2 resulted in a firm, continuous, transparent, crack-free, consolidated GR 650 thick film that is soluble in organic solvents. A thicker casting can be had, if the application demands, by stacking more confinement rings and dispensing a larger volume of GR 650UP. Thicker castings, however, were found to contain bubbles around their periphery, suggesting that a modified soft-bake routine is needed. The percentage of solids left behind after the soft-bake was calculated by comparing the weight of the dispensed GR 650UP and the weight of the soft-baked casting. The soft-baked casting was found to weigh approximately 35% of the original dispensed GR 650UP, which suggests that almost complete elimination of solvents had occurred (GR 650UP is a 35.3% by weight solution of GR 650F in a solvent mixture). The cast and soft-baked film is not planar because of the dual influence of shrinkage and surface tension of the GR 650UP solution. It is thickest near the periphery and thinnest around the central region (if the substrate was 'level' according to a spirit level).

The cast GR 650 thick film was then machined to make it planar while it is still on the substrate. The Precitech Optimum 2000 lathe equipped with a single crystal diamond turning tool was used for the purpose. The diamond turning tool had a nose radius of 1 mm and a rake angle of zero. The following was the sequence of operations employed:
1. The substrate was held centrally on a vacuum chuck working at vacuum of up to 701 mm Hg.
2. The highest point in the GR 650 casting was set as the starting reference point for the cutting tool. This procedure helps prevent sudden impact of the tool on the spots of the cast SOG during machining.
3. The cast material above the PTFE confinement ring is machined to the point where the PTFE ring starts to get machined. The machining parameters are listed in Table 3.

| | |
|---|---|
| Cutting speed | 2100 rpm |
| Feed rate | 20 mm/min (Rough cut) |
| | 10 mm/min (Finish cut) |
| Maximum depth of cut | 10 µm |

4. Machining is stopped and the sample checked to see if all cast material above the confinement ring has been machined off. Then the confinement ring is carefully peeled off the substrate. This is done to avoid the adhesion of PTFE on the diamond tool tip. Adhered PTFE results in a very poor surface finish of the GR 650 thick film.
5. Machining is then resumed to get the desired thickness value of GR 650 film. The finishing depth of cut was 2 um.

The targeted thickness of 100 um was achieved with a tolerance of ±5 um. Visual inspection of the surface under the microscope showed that the soft-baked SOG machines well. The thick film remained transparent after machining. Surface roughness measurement on Tencor Profilometer (average of roughness values at five randomly selected regions on the machined film; each scan-length measuring 5 mm) indicated a roughness average value ($R_a$) of approximately 130 angstroms.

EXAMPLE 2

Another experiment similar to Example 1 was carried out to obtain a hardened SOG material with a 200 um thickness. The conditions were substantially the same as in Example 1, but the confinement ring was increased to at least 200 um. Sufficient SOG material was placed in the confined area to fill it to a depth of 200 um. The procedure in Example 1 was modified in that the bake temperature was 150° C. rather than 75° C. The bake time and ramp-up/ramp-down rates were the substantially the same as in Example 1.

While the foregoing describes the invention in terms of specific embodiment, those of skill in the art will see many modifications and variations which are within the scope of the present invention. Some such modifications and variations are attached in the thesis of Vijay-Anandh Shanmugam, which is attached as Appendix 1 and incorporated by reference. All such modifications and variation are intended to come within the scope of the following claims.

References

Marzolin, C., Smith, S. P., Prentiss, M., and Whitesides, G. M., "Fabrication of Glass Microstructures by Micromolding of Sol-Gel Precursors," *Advanced Materials*, Vol. 10, 1998, 571–574.

Han, Y., "Investigation of Microlens Fabrication Processes," *Master's Thesis, Louisiana Tech University*, 1998.

Li, C. Y., Chisham, J., Andrews, M. P., Najafi, S. I., Mackenzie, J. D., and Poyghambarian, N., "Sol-gel Integrated Optical Coupler by Ultraviolet Light Imprinting," *Electronics Letters*, Vol. 31, 1995, 271–272.

Coudray, P., Chisham, J., Andrews, M. P., and Najafi, S. I., "Ultraviolet Light Imprinted Sol-gel Silica Glass Low-loss Waveguides for use at 1.55 mm," *Optical Engineering*, Vol. 36, 1997, 1234–1240.

What is claimed is:

1. A lithographic method of producing silica micro structures comprising the steps of:
   a. providing a carrier substrate with a confinement boundary on said carrier substrate;
   b. placing a SOG material within said confinement boundary;

c. removing solvents from said SOG material in order to obtain a hardened SOG film; and d. forming a pattern of interest on said hardened SOG film through x-ray lithography.

2. The method according to claim 1, further including the step of heating said SOG film until substantially converted to a silica-like oxide.

3. The method according to claim 1, wherein said step of removing solvents includes soft baking said SOG material at a temperature above a glass transition temperature of said SOG material.

4. The method according to claim 1, wherein said step of removing solvents includes placing said SOG material in a vacuum environment.

5. The method according to claim 2, wherein said carrier substrate and a SOG material have approximately the same coefficient of thermal expansion.

6. The method according to claim 2, wherein said SOG film is heated to at least about 400° C. for conversion to a silica-like oxide.

7. The method according to claim 2, wherein said confinement boundary has a height of at least 50 microns.

8. The method according to claim 2, wherein said carrier substrate includes a silicon base with a PTFE film formed over said silicon base.

9. The method according to claim 8, wherein before converting said SOG film to a silica-like oxide, said SOG film is exposed to a BHF solution for a sufficient time to etch off any oxide layer on a surface of said SOG film.

10. A method of producing a hardened organosilicon film comprising the steps of:

a. providing a carrier substrate and a SOG material have approximately the same coefficient of thermal expansion;

b. placing a confinement boundary having a height of at least 25 microns on said carrier substrate;

c. placing said SOG material within said confinement boundary; and d. removing solvents from said SOG material to obtain a hardened organosilicon film.

11. The method according to claim 10, wherein said step of removing solvents includes soft baking said SOG material at a temperature above a glass transition temperature of said SOG material.

12. The method according to claim 10, wherein said step of removing solvents includes placing said SOG material in a vacuum environment.

13. The method according to claim 11, further including machining said soft baked SOG material to a desired thickness.

14. The method according to claim 10, wherein said carrier substrate includes a silicon base with a PTFE film formed over said silicon base.

15. The method according to claim 14, wherein PTFE film is formed from a liquid spin-on solution.

16. The method according to claim 14, wherein an adhesive layer is formed between said silicon base and said PTFE film.

17. The method according to claim 10, wherein said confinement boundary has a height of at least 50 microns.

18. The method according to claim 17, wherein said confinement boundary has a height of at least 100 microns.

19. The method according to claim 18, wherein said confinement boundary has a height of at least 200 microns.

20. The method according to claim 10, wherein negative resist x-ray lithography is performed for a pattern of interest on said hardened SOG material.

21. The method according to claim 20, wherein said SOG material is exposed to a BHF solution for a sufficient time to etch off any oxide layer on a surface of said SOG material.

22. The method according to claim 21, further including heating said SOG material until said SOG material is substantially coverted to a silica-like oxide.

* * * * *